United States Patent
Gotti et al.

(10) Patent No.: US 11,641,788 B2
(45) Date of Patent: May 2, 2023

(54) RESISTIVE INTERFACE MATERIAL

(71) Applicant: Micron Technology, Inc., Boise, ID (US)

(72) Inventors: Andrea Gotti, Boise, ID (US); Dale W. Collins, Boise, ID (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 17/116,559

(22) Filed: Dec. 9, 2020

(65) Prior Publication Data

US 2022/0181549 A1   Jun. 9, 2022

(51) Int. Cl.
*H01L 45/00* (2006.01)
*H01L 27/24* (2006.01)

(52) U.S. Cl.
CPC ...... *H01L 45/1246* (2013.01); *H01L 27/2481* (2013.01); *H01L 45/06* (2013.01); *H01L 45/1233* (2013.01); *H01L 45/1253* (2013.01); *H01L 45/141* (2013.01); *H01L 45/16* (2013.01)

(58) Field of Classification Search
CPC ...................................................... H01L 45/00
See application file for complete search history.

(56) References Cited

U.S. PATENT DOCUMENTS

| | | |
|---|---|---|
| 10,263,039 B2 | 4/2019 | Pellizzer et al. |
| 10,672,833 B2 | 6/2020 | Tortorelli et al. |
| 2015/0044849 A1 | 2/2015 | Pio |
| 2016/0163975 A1 | 6/2016 | Petz et al. |
| 2019/0043924 A1 | 2/2019 | Conti et al. |
| 2019/0044060 A1 | 2/2019 | Russell et al. |

FOREIGN PATENT DOCUMENTS

TW    201419449 A    5/2014

OTHER PUBLICATIONS

Taiwanese Patent Office, "Office Action and Search Report", issued in connection with Taiwanese Patent Application No. 110145799 dated Oct. 24, 2022 (20 pages).

*Primary Examiner* — Marvin Payen
(74) *Attorney, Agent, or Firm* — Holland & Hart, LLP

(57) ABSTRACT

Methods, systems, and devices for a resistive interface material are described. A memory device may be fabricated using a sequence of steps that include forming a stack of materials by depositing a first metal layer, depositing a first electrode layer on the metal layer, depositing a memory material on the first electrode layer to form one or more memory cells, depositing a second electrode layer on the memory material, and depositing a second metal layer on the second electrode layer. A lamina (or multiple) having a relatively high resistivity may be included in the stack of materials to reduce or eliminate a current spike that may otherwise occur across the memory cells during an access operation.

25 Claims, 6 Drawing Sheets

RESISTIVE INTERFACE MATERIAL

FIELD OF TECHNOLOGY

The following relates generally to one or more systems for memory and more specifically to resistive interface material.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
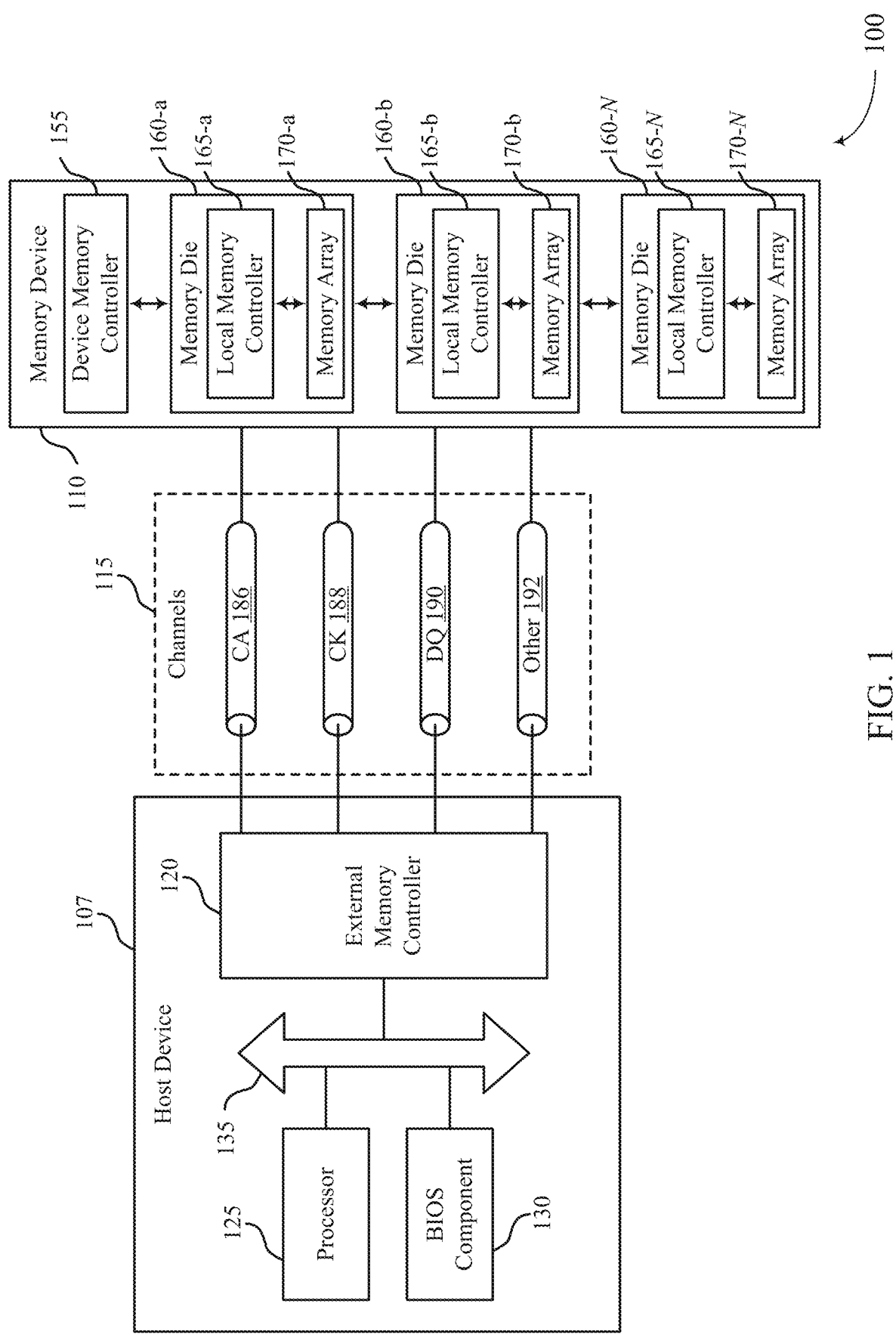
FIG. 1 illustrates an example of a system that supports a resistive interface material in accordance with examples as disclosed herein.

A memory device may include multiple memory decks of memory cells such that one array of memory cells may be stacked above another array of memory cells. Each memory cell may be coupled with various access lines, such as a word line and a bit line, that enable accesses to the memory cell.

Fabrication of a memory device may involve multiple steps to deposit and selectively remove various layers of materials. For example, fabricating a memory device may include deposition of metal materials, cell storage materials (e.g., a material that may be used to store one or more logic state of a memory cell), dielectric materials, resistive materials, sealers, or masks, or any combination thereof, and may include removal steps, such as etching or planarization, among other examples, to selectively remove portions of previously deposited materials and to form memory cell structures.

To access a memory cell, a voltage may be applied to an access line (e.g., to a word line or a bit line) and a resulting current may travel through the cell storage material. Over time, a memory cell may be accessed thousands of times, resulting in thousands of currents passing through a single cell storage material. In some instances, the current being passed through a single cell may spike (e.g., markedly increase), which may adversely affect the memory device, for example by reducing the longevity of the memory cell and, in turn, the memory device. Some memory systems may include a resistive material such as tungsten silicon nitride (WSiN) above or below the cell storage material.

Although WSiN may have some marginal effect on current spike, the presence of the material may have adverse effects during and after fabrication. For example, WSiN may have a different etch rate than other materials in the memory device, resulting in the need for a more complex fabrication process. Moreover, during an etching process, WSiN may be inadvertently sputtered adjacent to the memory cell, which may increase the presence of defects (e.g., shorts) and may otherwise lead to failure of a memory cell of the memory device. Accordingly, mitigating current spike across a memory cell while avoiding the adverse effects caused by the presence of WSiN may be desirable.

A memory device having a resistive interface material is described herein. In some examples, a memory device that may otherwise include a WSiN layer, may instead include a lamina (e.g., a relatively thin layer of material) to mitigate undesirable current spikes across a memory cell. The lamina may be formed by depositing a material having a relatively high resistivity (e.g., having a higher resistivity than at least some if not all other materials in the memory device, which may be in the form of a stack of materials) above or below a chalcogenide material, such as a chalcogenide storage element (e.g., above or below a memory cell). In some examples, the chalcogenide storage element may function, among other things, as a self-selecting storage element and may be referred to as a selector device or a selector element. In some examples, the lamina may be composed of an oxide, such as hafnium oxide (HfOx), aluminum oxide (AlOx), zirconium oxide (ZrOx), or silicon nitride (SiN), and may increase the resistance of the storage element. Among other advantages, having a lamina may provide a relatively high resistivity, thus reducing the effects of current spikes on the memory device while also reducing the complexity of fabricating the memory device. Accordingly, the relatively high resistivity of the lamina may better protect a storage element (e.g., a memory cell) from undesirable current spikes, which may prolong the lifecycle of the memory device, among other benefits.

Features of the disclosure are initially described in the context of a memory system and memory array as described with reference to FIGS. 1 and 2. Features of the disclosure are described in the context of cross sections of memory devices as described with reference to FIGS. 3A through 5B. These and other features of the disclosure are further illustrated by and described with reference to a flowchart that relates to resistive interface material as described with references to FIG. 6.

FIG. 1 illustrates an example of a system 100 that supports a resistive interface material in accordance with examples as disclosed herein. The system 100 may include a host device 107, a memory device 110, and a plurality of channels 115 coupling the host device 107 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 107. The host device 107 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 107 may refer to the hardware, firmware, software, or a combination thereof that implements the functions of an external memory controller 120. In some examples, the external memory controller 120 may be referred to as a host or a host device 107.

A memory device 110 may be an independent device or a component that is operable to provide physical memory addresses/space that may be used or referenced by the system 100. In some examples, a memory device 110 may be configurable to work with one or more different types of host devices 107. Signaling between the host device 107 and the memory device 110 may be operable to support one or more of: modulation schemes to modulate the signals, various pin configurations for communicating the signals, various form factors for physical packaging of the host device 107 and the memory device 110, clock signaling and synchronization between the host device 107 and the memory device 110, timing conventions, or other factors.

The memory device 110 may be operable to store data for the components of the host device 107. In some examples, the memory device 110 may act as a slave-type device to the host device 107 (e.g., responding to and executing commands provided by the host device 107 through the external memory controller 120). Such commands may include one or more of a write command for a write operation, a read command for a read operation, a refresh command for a refresh operation, or other commands.

The host device 107 may include one or more of an external memory controller 120, a processor 125, a basic input/output system (BIOS) component 130, or other components such as one or more peripheral components or one or more input/output controllers. The components of host device 107 may be coupled with one another using a bus 135.

The processor 125 may be operable to provide control or other functionality for at least portions of the system 100 or at least portions of the host device 107. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 107. The BIOS component 130 may also manage data flow between the processor 125 and the various components of the system 100 or the host device 107. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 107 (e.g., the processor 125) and the memory device 110. The external memory controller 120 may convert or translate communications exchanged between the components of the host device 107 and the memory device 110. In some examples, the external memory controller 120 or other component of the system 100 or the host device 107, or its functions described herein, may be implemented by the processor 125. For example, the external memory controller 120 may be hardware, firmware, or software, or some combination thereof implemented by the processor 125 or other component of the system 100 or the host device 107. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 107 may exchange information with the memory device 110 using one or more channels 115. The channels 115 may be operable to support communications between the external memory controller 120 and the memory device 110. Each channel 115 may be examples of transmission mediums that carry information between the host device 107 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 107 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory array 170 may include one or more memory cells that include a chalcogenide storage element, which may function, among other things, as a self-selecting storage element and may be referred to as a selector device or a selector element. The chalcogenide storage element may be coupled with one or more access lines (e.g., a word line and a bit line) via a respective electrode (e.g., a first electrode and a second electrode). As described herein, a chalcogenide storage element and respective electrodes resulting from one or more depositing and one or more removal process may be referred to as a pillar or a stack.

In some examples, a pillar may include one or more laminae to protect the chalcogenide element from undesirable current spikes that may occur during access operations and to simplify manufacturing processes related to the pillar compared to other potential processes or techniques. The lamina may be formed by depositing a material having a relatively high resistivity above or below the chalcogenide storage element (e.g., above or below the selector device). In some examples, the lamina may be composed of an oxide, such as hafnium oxide (HfOx), aluminum oxide (AlOx), zirconium oxide (ZrOx), or silicon nitride (SiN), and may increase the resistance of the pillar overall and one or more materials in the pillar. Accordingly, the relatively high resistivity of the one or more laminae may protect the storage element from current spikes that would otherwise be caused by current flowing, for example, from an access line (e.g., from a word line or a bit line) through one or more parts of the pillar, such as the storage element.

Figure 2:
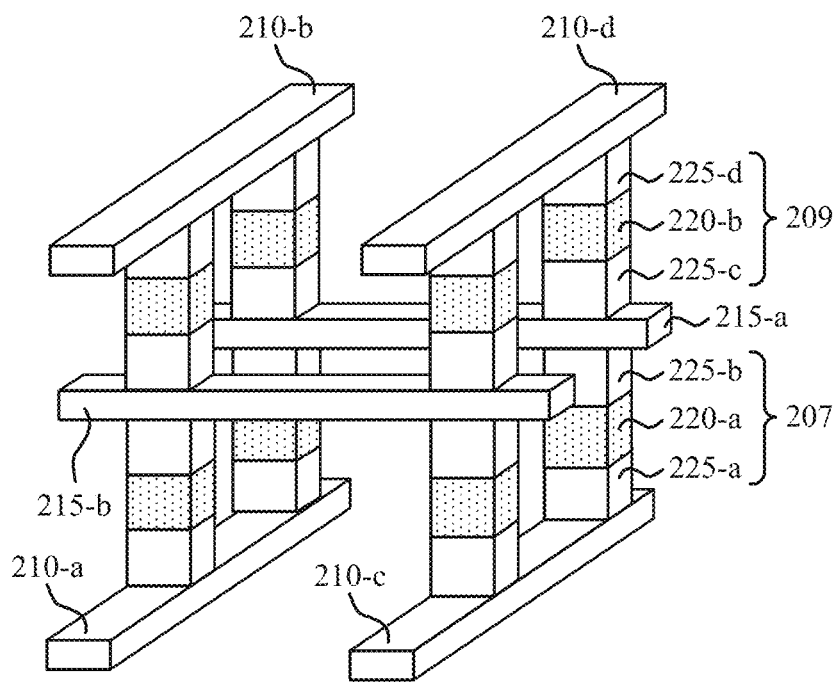
FIG. 2 illustrates an example of a memory array that supports a resistive interface material in accordance with examples as disclosed herein.

FIG. 2 illustrates an example of a memory array 200 in accordance with examples as disclosed herein. Memory array 200 may be an example of portions of the memory arrays or memory dies described with reference to FIG. 1. The memory array 200 may include a first deck 207 of memory cells that is positioned above a substrate (not shown) and a second deck 209 of memory cells on top of the first array or deck 207. Though the example of memory array 200 includes two decks 207, 209, the memory array 200 may include any quantity of decks (e.g., one or more than two).

Memory array 200 may also include a row line 210-*a*, a row line 210-*b*, a row line 210-*c*, a row line 210-*d*, a column line 215-*a*, and a column line 215-*b*, which may be examples of row lines 210 and column lines 215. One or more memory cells of the first deck 207 and the second deck 209 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 2 are labeled with a numeric indicator, other corresponding elements are not labeled, although they are the same or would be understood to be similar, in an effort to increase visibility and clarity of the depicted features.

One or more memory cells of the first deck 207 may include one or more of an electrode 225-*a*, a storage element 220-*a*, or an electrode 225-*b*. One or more memory cells of the second deck 209 may include an electrode 225-*c*, a storage element 220-*b*, and an electrode 225-*d*. The storage elements 220 may be examples of a chalcogenide material, such as a phase change storage element, a thresholding storage element, or a self-selecting storage element. The memory cells of the first deck 207 and second deck 209 may, in some examples, have common conductive lines such that corresponding memory cells of one or more decks 207 and one or more decks 209 may share column lines 215 or row lines 210. For example, the first electrode 225-*c* of the second deck 209 and the second electrode 225-*b* of the first deck 207 may be coupled with column line 215-*a* such that the column line 215-*a* may be shared by vertically adjacent memory cells.

In some examples, the material of the storage element 220 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, the storage element 220 may be an example of a phase change memory cell. In such examples, the material used in the storage element 220 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration). In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 220 may be an example of a self-selecting memory cell. In such examples, the material used in the storage element 220 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 225-a, storage element 220-a, and electrode 225-b), a polarity used for a write operation may influence (determine, set, program) a particular behavior or characteristic of the material of the storage element 220, such as the threshold voltage of the material. The difference in threshold voltages of the material of the storage element 220 depending on the logic state stored by the material of the storage element 220 (e.g., the difference between the threshold voltage when the material is storing a logic state '0' versus a logic state '1') may correspond to the read window of the storage element 220.

The architecture of memory array 200 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 2 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 2 may be electrically coupled with one another as shown or described but rearranged physically (e.g., a storage element 220 and possibly a selection element or electrode 225 may be electrically in series between a row line 210 and a column line 215 but need not be in a pillar or stack configuration).

In some examples, the first deck 207 and/or the second deck 209 may include one or more laminae having a relatively high resistivity compared to other elements. By including one or more laminae in the first deck 207 and/or the second deck 209, a respective storage element 220, which may be referred to as a selector device, may be less susceptible to current spikes, for example, during access operations. For example, the one or more lamina may be formed by depositing a material having a relatively high resistivity above and/or below a storage element 220. In some examples, the one or more laminae may be composed of an oxide, such as hafnium oxide (HfOx), aluminum oxide (AlOx), zirconium oxide (ZrOx), or silicon nitride (SiN), and may increase the resistance of the first deck 207, the second deck 209, or a memory cell (e.g., of the storage element 220). Accordingly, the relatively high resistivity of the one or more laminae may protect the memory cell from current spikes that would otherwise be caused by current flowing from the from an access line (e.g., from a row line 210 or column line 215) through the pillar, including the storage element.

Figure 3A:
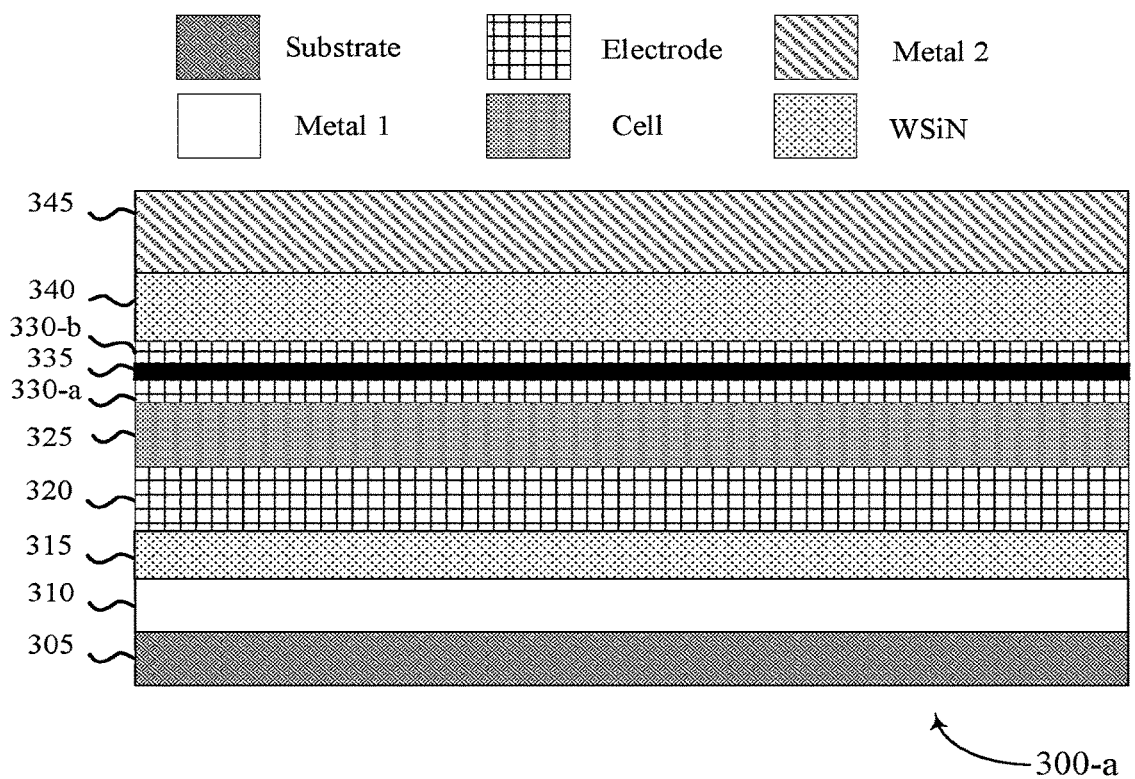
FIGS. 3A and 3B illustrate examples of cross sections of memory devices that support a resistive interface material in accordance with examples as disclosed herein.

FIG. 3A shows a cross section 300-a of a portion a memory device after layers of materials have been deposited on a substrate as part of a sequence of processes to fabricate the memory device in accordance with examples of the present disclosure. Various deposition processes may be used to deposit the layers of FIG. 3A, including but not limited to chemical vapor deposition (CVD), metal-organic chemical vapor deposition (MOCVD), plasma-enhanced CVD (PECVD), physical vapor deposition (PVD), sputter deposition, atomic layer deposition (ALD), which may include thermal and plasma assisted (enhanced) ALD, or molecular beam epitaxy (MBE), or any combination thereof, among other techniques.

Cross section 300-a may include substrate 305. In some examples, substrate 305 may be a silicon substrate, an insulating substrate such as silicon dioxide or silicon nitride, a polysilicon substrate, other examples, or any combination thereof. In some examples, other components of the memory device may be formed on other portions of substrate 305, such as logic circuitry associated with a memory controller, a sense component, or other components.

Cross section 300-a may include a first metal material (e.g., a first metal layer) 310. The first metal layer 310 may be a conductive layer formed by depositing a metal material, such as a material that includes tungsten, aluminum, titanium, titanium nitride, silicon, polysilicon, or any combination thereof, above (e.g., onto) substrate 305. The first metal layer 310 may correspond to an access line, such as a word line or bit line, that may be used to access one or more memory cells of the memory device.

Cross section 300-*a* may include a layer (e.g., a resistive material) 315. The layer 315 may be formed by depositing a material having a relatively high resistivity, such as a material that includes tungsten, silicon, nitrogen, or any combination thereof, above (e.g., onto) the first metal layer 310. For example, the layer 315 may be composed of a tungsten silicon nitride (WSiN) material, which may have a higher resistivity than the first metal layer 310.

Cross section 300-*a* may include a first electrode material (e.g., a first electrode layer) 320, a memory material (e.g., a memory material layer) 325, and second electrode material (e.g., a second electrode layer) 330. The first electrode layer 320 may be formed by depositing a first electrode material, such as a conductive carbon-based material, above (e.g., onto) the layer 315. The memory material 325 may be formed by depositing a cell storage material above (e.g., onto) the first electrode layer 320. The cell storage material may be, for example, a variable resistance material, a chalcogenide material, or a phase change material, and may be deposited to result in forming a memory cell above the first electrode layer 320.

The second electrode layer 330 may be formed by depositing a second electrode material above (e.g., onto) the memory material 325. The second electrode material 330 may be the same material as the first electrode material, for example, a conductive carbon-based material, or may be a different conductive material, such as a different metal material. Collectively, the first electrode layer 320, the memory material 325, and the second electrode layer 330 may be used to form one or more memory cells, at least some of which if not each of which may be coupled with (e.g., connected to, in contact with) the first metal layer 310. The memory material may be used as a storage element of the memory cell to store a logic state of the memory cell as well as in some examples being a selector device to enable selection of the resulting memory cell.

In some examples, the second electrode layer 330 may include one or more portions. For example, a first portion of the second electrode layer 330-*a* may be formed by depositing a second electrode material above (e.g., onto) the memory material 325. The first portion of the second electrode material 330-*a* may be the same material as the first electrode material, for example, a conductive carbon-based material, or may be a different conductive material, such as a different metal material. The first portion of the second electrode layer 330-*a* may be deposited first (e.g., before a second portion of the second electrode material 330-*b*) such that a lamina (e.g., a lamina) 335 may be deposited between the layers (e.g. after depositing the first portion of the second electrode layer 330-*a* and before depositing the second portion of the second electrode layer 330-*b*. As described herein, the lamina 335 may be included as part of the overall resulting memory cell and may include material properties, such as a relatively high resistivity among others, that mitigates undesirable current spikes during access operations, among other benefits. In some examples, the lamina 335 has a resistivity greater than first metal layer 310, which may include a WSiN material. In some example, the lamina 335 may have a resistivity greater than all the materials shown in cross section 300-*a*.

Cross section 300-*a* may include a lamina (e.g., a relatively thin layer of material) 335. The lamina 335 may be formed by depositing a material having a relatively high resistivity, such as a material that includes hafnium, aluminum, oxygen, another material, or any combination thereof, above (e.g., onto) the first portion of the second electrode layer 330-*a*. For example, the lamina 335 may be composed of hafnium oxide (HfOx), aluminum oxide (AlOx), zirconium oxide (ZrOx), or silicon nitride (SiN), and may increase the resistance of a resulting memory cell (e.g., a memory cell composed of a memory material 325) to prevent undesirable current spikes during access operations. Moreover, the lamina 335 may be associated with an etch rate that is the same as or similar to other elements in the stack of materials (e.g., shown in cross section 300-*a*). Accordingly, the lamina 335 may reduce undesirable current spikes across the memory material 325, while simplifying the fabrication process of the associated memory device due the need for fewer etching and/or material removal steps.

The lamina 335 may provide increased benefits when compared to, for example, alternatives such as having one or more layers, such as WSiN. For example, the lamina 335 may be deposited in a location (e.g., above a first portion of the second electrode layer 330-*a*) that could otherwise include WSiN. Omitting one or more layers of WSiN and adding the lamina 335 may further increase the resistivity of the memory cell, which may better protect the memory cell from undesirable current spikes during access operations while also facilitating better manufacturing processes. For example, including the lamina 335 between the memory material 325 and the second metal layer 345 may mitigate current spikes that would otherwise be caused by current flowing from the second metal layer 345 to the memory material 325. Moreover, a lesser quantity (e.g., a decreased thickness) of lamina 335 may be used compared to other examples of WSiN being used. For example, at least 5 nm of WSiN may have been able to be used to provide some resistive benefit, whereas a lamina 335 less than or equal to 1 nm may provide increased resistive benefits. Including a lamina 335 having a relatively small thickness may reduce the overall height of the memory cell, among other benefits, which may also be desirable.

In some examples, the second electrode layer 330 may include a second portion 330-*b* formed above the lamina 335. The second portion of the second electrode layer 330-*b* may be formed by depositing a second electrode material above (e.g., onto) the lamina 335. The second portion of the second electrode material 330-*b* may be the same material as the first electrode layer 320 (or the first portion of the second electrode material 330-*a*), for example, or may be a different conductive material, such as a different metal material. The second portion of the second electrode layer 330-*b* may be deposited after the lamina 335 such that the lamina 335 is located between the first portion of the second electrode layer 330-*a* and the second portion of the second electrode layer.

Cross section 300-*a* may include an optional second layer (e.g., a second resistive material) 340. The second layer 340 may be formed by depositing a material having a relatively high resistivity, such as a material that includes tungsten, silicon, nitrogen, or any combination thereof, above (e.g., onto) a second portion (e.g., a upper portion) of the second electrode layer 330. For example, the second layer 340 may be composed of a tungsten silicon nitride (WSiN) material, which may have a higher resistivity than the second metal layer 345.

The cross section 300-*a* may include a second metal layer 345. The second metal layer 345 may be formed by depositing a metal material above a portion of the second electrode layer 330 during a deposition process. For example, the second metal layer 345 may be deposited on the second resistive layer 340 or a second portion (e.g., a upper portion)

of the second electrode layer 330 (if the second resistive layer is not included in the stack of materials). The second metal layer 345 may correspond to an access line, such as a word line or bit line, that may be used to access one or more memory cells. In some examples, if the first metal layer 310 corresponds to a word line, the second metal layer 345 may correspond to a bit line, or vice versa. The first electrode layer 320 and second electrode layer 330 may provide conductive connections to first metal layer 310, or second metal layer 345, or both.

Figure 3B:
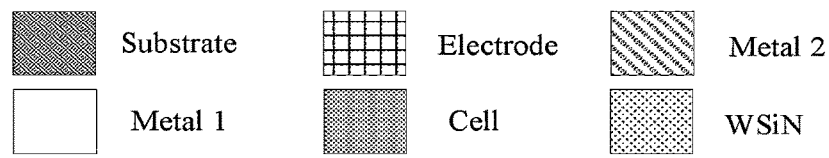

FIG. 3B depicts cross section 300-*b*, which may represent a cross section of one or more pillars 350 that are formed after one or more deposition and one or more removal processes have been completed. For example, the pillars 350 may represent the result from etching different stacks of materials represented by the cross section 300-*a*. The pillars 350 may each include a memory cell 105 and may be formed after performing one or more removal procedures to remove a portion of the first metal layer 310-*a*, the layer 315-*a*, the first electrode layer 320-*a*, the memory material 325-*a*, one or more portions of the second electrode material 330-*a*, the lamina 335-*a*, and the second metal layer 345-*a*. In some examples, the removal procedure may remove a portion of a second resistive layer 340. The removal process may include a planarization process, such as a CMP, and/or an etching process such as chemical etching (also referred to as "wet etching"), plasma etching (also referred to as "dry etching"), other examples, or any combination thereof.

A first pillar 350-*a* depicted in the cross section 300-*b* may include a first metal layer 310-*a*, a layer 315-*a*, a first electrode layer 320-*a*, a memory material 325-*a*, a first portion of a second electrode material 330-*c*, a lamina 335-*a*, a second portion of the second electrode material 330-*d*, a second resistive layer 340-*a*, and a second metal layer 345-*a*. The first pillar 350-*a* may include a memory cell 105-*a*, which may include the first electrode layer 320-*a*, the memory material 325-*a*, the first portion of the second electrode material 330-*c*, the lamina 335-*a*, and the second portion of the second electrode material 330-*d*.

A second pillar 350-*b* depicted in the cross section 300-*b* may include a first metal layer 310-*a*, a layer 315-*a*, a first electrode layer 320-*a*, a memory material 325-*a*, a first portion of a second electrode material 330-*c*, a lamina 335-*a*, a second portion of the second electrode material 330-*d*, and a second metal layer 345-*a*. The first pillar 350-*a* may include a memory cell 105-*b*, which may include the first electrode layer 320-*a*, the memory material 325-*a*, the first portion of the second electrode material 330-*c*, the lamina 335-*a*, and the second portion of the second electrode material 330-*d*. Compared to the first pillar 350-*a* the second pillar 350-*b* may omit the second resistive layer 340-*a* (e.g., may not include the second resistive layer 340-*a*), which may be a matter of design choice.

The first pillar 350-*a* and the second pillar 350-*b* may each be formed based on etching (e.g., one or more times) a stack of materials, which may include one or more of the materials illustrated in cross section 300-*a*. In some examples, the materials may be etched in multiple directions (e.g., in two directions), and materials may be deposited before or after a single etching process to form the first pillar 350-*a* and/or the second pillar 350-*b* in a deck of memory cells. For example, the first metal material 310-*a* of the first pillar 350-*a* or the second pillar 350-*b* may be patterned (e.g., etched) before being deposited. Patterning the first metal material 310-*a* may result in a non-self-aligned access line. In other examples, the first metal material 310-*a* of the first pillar 350-*a* or the second pillar 350-*b* may be patterned (e.g., etched) after being deposited. Patterning the first metal material 310-*a* may result in a self-aligned access line.

Thus, having one or more laminae 335 including an oxide material, such as hafnium oxide (HfOx), aluminum oxide (AlOx), zirconium oxide (ZrOx), or silicon nitride (SiN), and having a relatively high resistivity compared to at least some if not all other materials (e.g., materials shown in cross section 300-*a*) may mitigate undesirable current spikes that may otherwise during access operations as well as enable a more streamlined and simplified manufacturing process compared to other techniques.

Figure 4A:
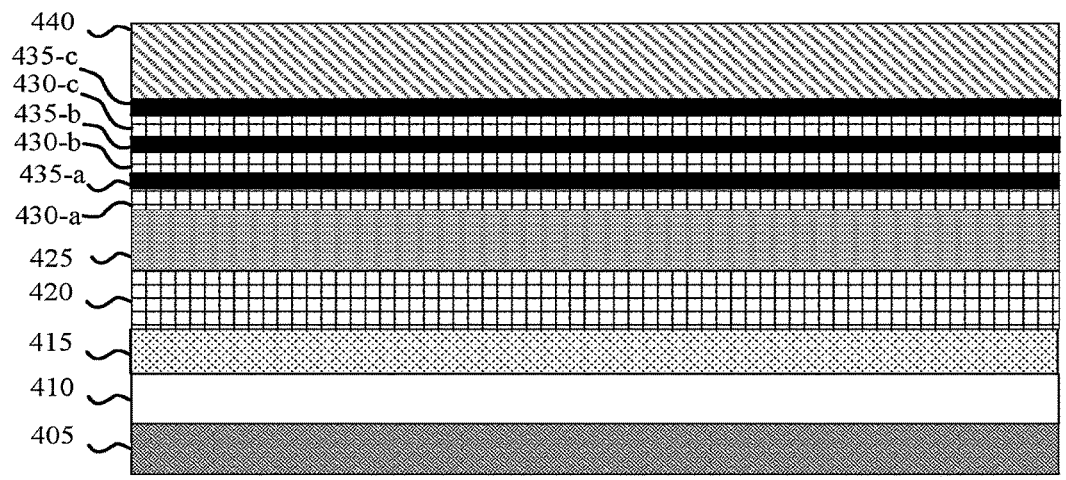
FIGS. 4A and 4B illustrate examples of cross sections of memory devices that support a resistive interface material in accordance with examples as disclosed herein.

FIG. 4A shows a cross section 400-*a* of a portion a memory device after layers of materials have been deposited on a substrate as part of a sequence of processes to fabricate the memory device in accordance with examples of the present disclosure. Various deposition processes may be used to deposit the layers of FIG. 4A, including but not limited to chemical vapor deposition (CVD), metal-organic chemical vapor deposition (MOCVD), plasma-enhanced CVD (PECVD), physical vapor deposition (PVD), sputter deposition, atomic layer deposition (ALD), which may include thermal and plasma assisted (enhanced) ALD, or molecular beam epitaxy (MBE), or any combination thereof, among other techniques.

Cross section 400-*a* may include a substrate 405. In some examples, substrate 405 may be a silicon substrate, an insulating substrate such as silicon dioxide or silicon nitride, a polysilicon substrate, other examples, or any combination thereof. In some examples, other components of the memory device may be formed on other portions of substrate 405, such as logic circuitry associated with a memory controller, a sense component, or other components.

Cross section 400-*a* may include a first metal material (e.g., a first metal layer) 410. The first metal layer 410 may be a conductive layer formed by depositing a metal material, such as a material that includes tungsten, aluminum, titanium, titanium nitride, silicon, polysilicon, ruthenium (Ru), molybdenum (Mo), or any combination thereof, above (e.g., onto) substrate 405. The first metal layer 410 may correspond to an access line, such as a word line or bit line, that may be used to access one or more memory cells of the memory device.

Cross section 400-*a* may include a layer (e.g., a resistive material) 415. The layer 415 may be formed by depositing a material having a relatively high resistivity, such as a material that includes tungsten, silicon, nitrogen, or any combination thereof, above (e.g., onto) the first metal layer 410. For example, the layer 415 may be composed of a tungsten silicon nitride (WSiN) material, which may have a higher resistivity than the first metal layer 410.

Cross section 400-*a* may include a first electrode material (e.g., a first electrode layer) 420, a memory material (e.g., a memory material layer) 425, and second electrode material (e.g., a second electrode layer) 430. The first electrode layer 420 may be formed by depositing a first electrode material, such as a conductive carbon-based material, above (e.g., onto) the layer 415. The memory material 425 may be formed by depositing a cell storage material above (e.g., onto) the first electrode layer 420. The cell storage material may be, for example, a variable resistance material, a chalcogenide material, or a phase change material and may be deposited to result in forming a memory cell above the first electrode layer 420.

The second electrode layer 430 may be formed by depositing a second electrode material above (e.g., onto) cell the memory material 425. The second electrode material 430 may be the same material as the first electrode material, for example, a conductive carbon-based material, or may be a different conductive material, such as a different metal material. Collectively, the first electrode layer 420, the memory material 425, and the second electrode layer 430 may be used to form one or more memory cells, at least some of which if not each of which may be coupled with (e.g., connected to, in contact with) the first metal layer 410. The memory material may be used as a storage element of the memory cell to store a logic state of the memory cell as well as in some examples being a selector device to enable selection of the resulting memory cell.

In some examples, the second electrode layer 430 may include one or more portions. For example, a first portion of the second electrode layer 430-*a* may be formed by depositing a second electrode material above (e.g., onto) the memory material 425. The first portion of the second electrode material 430-*a* may be the same material as the first electrode material 420, for example, a conductive carbon-based material, or may be a different conductive material, such as a different metal material. The first portion of the second electrode layer 430-*a* may be deposited first (e.g., before a subsequent portion of the second electrode material 430) such that a lamina 435 (e.g., a first portion of a lamina 435-*a*) may be deposited between the layers (e.g. after depositing the first portion of the second electrode layer 430-*a* and before depositing the second portion of the second electrode layer 430-*b* and/or after depositing the second portion of the second electrode layer 430-*b* and before depositing the third portion of the second electrode layer 430-*c*. As described herein, the lamina 335 may be included as part of the overall resulting memory cell and may include material properties, such as a relatively high resistivity among others, that mitigates undesirable current spikes during access operations, among other benefits. In some examples, the lamina 435-*a*, 435-*b*, and/or 435-*c* has a resistivity greater than first metal layer 410, which may include a WSiN material. In some example, the lamina 435-*a*, 435-*b*, and/or 435-*c* may have a resistivity greater than all the materials shown in cross section 400-*a*.

Cross section 400-*a* may include a lamina (e.g., a first lamina) 435-*a*. The first lamina 435-*a* may be formed by depositing a material having a relatively high resistivity, such as a material that includes hafnium, aluminum, oxygen, or any combination thereof, above (e.g., onto) the second electrode layer 430 (or above (e.g., onto) the first portion of the second electrode layer 430-*a*). For example, the lamina 435-*a* may be composed of hafnium oxide (HfOx), aluminum oxide (AlOx), zirconium oxide (ZrOx), or silicon nitride (SiN), and may increase the resistance of a resulting memory cell (e.g., a memory cell composed of a memory material 425) to prevent undesirable current spikes during access operations. Moreover, the lamina 435-*a* may be associated with an etch rate that is the same as or similar to other elements in the stack of materials (e.g., shown in cross section 400-*a*). Accordingly, the lamina 435-*a* may reduce undesirable current spikes across the memory material 425, while simplifying the fabrication process of the associated memory device due the need for fewer etching and/or material removal steps.

The first lamina 435-*a* may provide increased benefits when compared to, for example, alternatives such as having one or more layers, such as WSiN. For example, the first lamina 435-*a* may be deposited in a location (e.g., above a first portion of the second electrode layer 430-*a*) that could otherwise include WSiN. Omitting one or more layers of WSiN and adding the first lamina 435-*a* may further increase the resistivity of the memory cell, which may better protect the memory cell from undesirable current spikes during access operations while also facilitating better manufacturing processes. For example, including the first lamina 435-*a* between the memory material 425 and the second metal layer 345 may mitigate current spikes that would otherwise be caused by current flowing from the second metal layer 440 to the memory material 425. Moreover, a lesser quantity (e.g., a decreased thickness) of lamina 435 may be used. For example, at least 5 nm of WSiN may have been able to be used to provide some resistive benefits, whereas a lamina 435 less than or equal to 1 nm may provide increased resistive benefits. Including a lamina 435 having a relatively small thickness may reduce the overall height of the memory cell, among other benefits, which may also be desirable.

In some examples, the second electrode layer 430 may include a second portion 430-*b* formed above the first lamina 435-*a*. The second portion of the second electrode layer 430-*b* may be formed by depositing a second electrode material above (e.g., onto) the first lamina 435-*a*. The second portion of the second electrode material 430-*b* may be the same material as the first electrode material 420 (or the first portion of the second electrode material 430-*a*), for example, or may be a different conductive material, such as a different metal material. The second portion of the second electrode layer 430-*b* may be deposited after the first lamina 435-*a* such that the first lamina 435-*a* is located between the first portion of the second electrode layer 430-*a* and the second portion of the second electrode layer 430-*b*.

In some examples, the cross section 400-*a* may include a second lamina (e.g., a second lamina) 435-*b*. The second lamina 435-*b* may be formed by depositing a material having a relatively high resistivity, such as a material that includes hafnium, aluminum, oxygen, or any combination thereof, above the second portion of the second electrode layer. In some examples, the second lamina 435-*b* may include a same or a different resistive material as the first lamina 435-*a*. For example, the second lamina 435-*b* may be composed of different materials or combinations of materials, or different levels of hafnium oxide (HfOx), aluminum oxide (AlOx), zirconium oxide (ZrOx), or silicon nitride (SiN) (e.g., a higher concentration of one or the other), and may increase the resistance of a memory cell (e.g., a memory cell composed of a memory material 425) to prevent undesirable current spikes during access operations. For example, the second lamina 435-*b* may be composed of a same material and/or same combinations of materials, such as relatively the same levels of hafnium oxide (HfOx), aluminum oxide (AlOx), zirconium oxide (ZrOx), or silicon nitride (SiN) (e.g., a relatively same concentration of one or the other or both), and may increase the resistance of a memory cell (e.g., a memory cell composed of a memory material 425) to prevent undesirable current spikes during access operations.

The first lamina 435-*a* and second lamina 435-*b* may individually and collectively increase the resistivity of the memory cell, which may better protect the memory cell from undesirable current spikes during access operations. For example, the presence of the first lamina 435-*a* and the second lamina 435-*b* may increase the resistivity of the memory cell relative to WSiN (or another conductive material). Additionally or alternatively, the presence of the second lamina 435-*b* may further increase the resistivity of the memory cell as compared to only the first lamina 435-*a* being included in the stack of materials. Ultimately, the resistivity of the memory cell may be increased due to the collective thickness of the first lamina 435-*a* and second lamina 435-*b*. As described herein, a thickness of each of the laminae 435 may be less than or equal to 1 nm.

In some examples, the second electrode layer 430 may include a third portion 430-*c* formed above the second lamina 435-*b*. The third portion of the second electrode layer 430-*c* may be formed by depositing a second electrode material above (e.g., onto) the second lamina 435-*b*. The third portion of the second electrode material 430-*c* may be the same material as the first electrode material 420 (or the first portion of the second electrode material 430-*a* or the third portion of the second electrode material 430-*b*), for example, or may be a different conductive material, such as a different metal material. The third portion of the second electrode layer 430-*c* may be deposited after the second lamina 435-*b* such that the second lamina 435-*b* is located between the second portion of the second electrode layer 430-*b* and the third portion of the second electrode layer 430-*c*.

In some examples, the cross section 400-*a* may include a third lamina (e.g., a third lamina) 435-*c*. Like the first lamina 435-*a* and the second lamina 435-*b*, the third lamina 435-*c* may be formed by depositing a material that includes hafnium, aluminum, oxygen, or any combination thereof, above the second portion of the second electrode layer. The third lamina 435-*c* may include a same or a different resistive material as the first lamina 435-*a*, the second lamina 435-*b*, or both. For example, the second lamina 435-*b* may be composed different materials or combinations of different materials, or different levels of hafnium oxide (HfOx), aluminum oxide (AlOx), zirconium oxide (ZrOx), or silicon nitride (SiN) (e.g., a higher concentration of one or the other), and may increase the resistance of a memory cell (e.g., a memory cell composed of a memory material 425) to prevent undesirable current spikes during access operations. For example, the third lamina 435-*c* may be composed of a same material and/or same combinations of materials, such as relatively the same levels of hafnium oxide (HfOx), aluminum oxide (AlOx), zirconium oxide (ZrOx), or silicon nitride (SiN) (e.g., a relatively same concentration of one or the other or both), and may increase the resistance of a memory cell (e.g., a memory cell composed of a memory material 425) to prevent undesirable current spikes during access operations.

The first lamina 435-*a*, second lamina 435-*b*, and third lamina 435-*c* may collectively increase the resistivity of the memory cell, which may better protect the memory cell from undesirable current spikes during access operations. For example, the presence of the first lamina 435-*a*, the second lamina 435-*b*, and the third lamina 435-*c* may increase the resistivity of the memory cell relative to WSiN (or another conductive material). Additionally or alternatively, the presence of the third lamina 435-*c* may further increase the resistivity of the memory cell as compared to only the first lamina 435-*a* and/or the second lamina 435-*b* being included in the stack of materials. Ultimately, the resistivity of the memory cell may be increased due to the collective thickness of the first lamina 435-*a*, the second lamina 435-*b*, and the third lamina 435-*c*. As described herein, a thickness of each of the laminae 435 may be less than or equal to 1 nm.

The cross section 400-*a* may include a second metal layer 440. The second metal layer 440 may be formed by depositing a metal material above (e.g., onto) the second electrode material 430 (or above (e.g., onto) a portion of the second electrode material). The second metal layer 440 may correspond to an access line, such as a word line or bit line, that may be used to access one or more memory cells. In some examples, if the first metal layer 410 corresponds to a word line, the second metal layer 440 may correspond to a bit line, or vice versa. The first electrode layer 420 and second electrode layer 430 may provide conductive connections to first metal layer 410, or second metal layer 440, or both.

Figure 4B:
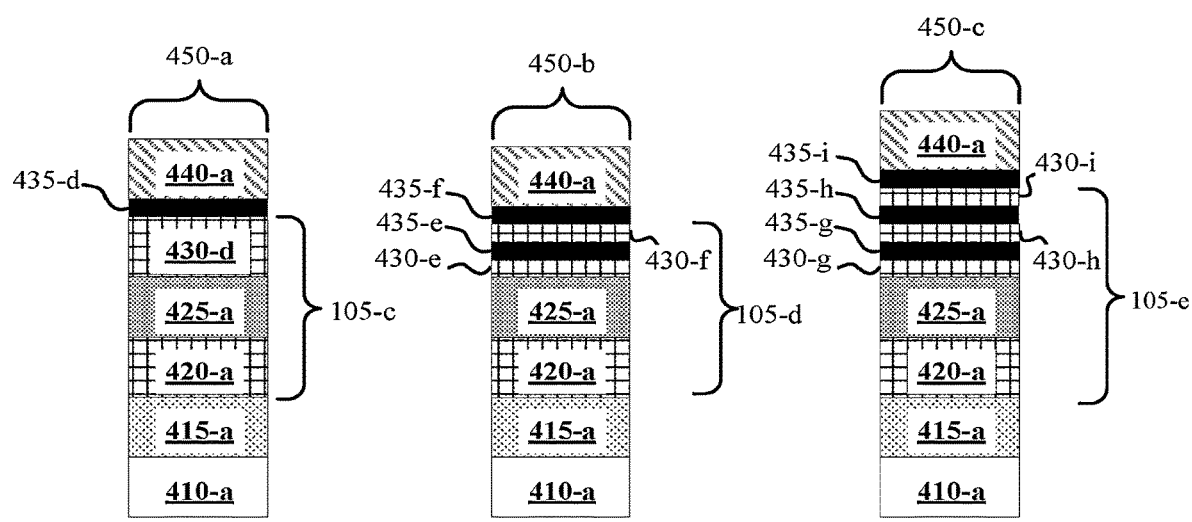

FIG. 4B depicts cross section 400-*b*, which may represent a cross section of one or more pillars 450 that are formed after one or more deposition and one or more removal processes have been completed. For example, the pillars 450 may represent the result etching different stacks of materials represented by the cross section 400-*a*. The pillars 450 may each include a memory cell 105 and may be formed after performing one or more removal procedures to remove a portion of the first metal layer 410-*a*, the layer 415-*a*, the first electrode layer 420-*a*, the memory material 425-*a*, one or more portions of the second electrode material 430, one or more portions of the lamina 435, and the second metal layer 445-*a*. The removal process may include a planarization process, such as a CMP, and/or an etching process such as chemical etching (also referred to as "wet etching"), plasma etching (also referred to as "dry etching"), other examples, or any combination thereof.

A first pillar 450-*a* depicted in the cross section 400-*b* may include a first metal layer 410-*a*, a layer 415-*a*, a first electrode layer 420-*a*, a memory material 425-*a*, a second electrode layer 430-*d*, a lamina 435-*d*, and a second metal layer 440-*a*. The first pillar 350-*a* may include a memory cell 105-*c*, which may include the first electrode layer 420-*a*, the memory material 425-*a*, and the first portion of the second electrode material 430-*c*. The lamina 435-*d* may or may not be included in the memory cell 105-*c*.

A second pillar 450-*b* depicted in the cross section 400-*b* may include a first metal layer 410-*a*, a layer 415-*a*, a first electrode layer 420-*a*, a memory material 425-*a*, a first portion of a second electrode layer 430-*e*, a first lamina 435-*e*, a second portion of the second electrode layer 430-*f*, a second lamina 435-*f*, and a second metal layer 440-*a*. The second pillar 450-*b* may include a memory cell 105-*d*, which may include the first electrode layer 420-*a*, the memory material 425-*a*, the first portion of the second electrode layer 430-*e*, the first lamina 435-*e*, and the second portion of the second electrode layer 430-*f*. The second lamina 435-*f* may or may not be included in the memory cell 105-*d*. Compared to the first pillar 450-*a*, the second pillar 450-*b* may include an additional lamina layer 435, which may further increase the resistivity of the memory cell.

A third pillar 450-*c* depicted in the cross section 400-*b* may include a first metal layer 410-*a*, a layer 415-*a*, a first electrode layer 420-*a*, a memory material 425-*a*, a first portion of a second electrode layer 430-*g*, a first lamina 435-*g*, a second portion of the second electrode layer 430-*h*, a second lamina 435-*h*, a third portion of the second electrode layer 430-*i*, a third lamina 435-*i*, and a second metal layer 440-*a*. The third pillar 450-*c* may include a memory cell 105-*e*, which may include the first electrode layer 420-*a*, the memory material 425-*a*, the first portion of the second electrode layer 430-*g*, the first lamina 435-*g*, the second portion of the second electrode layer 430-*h*, the second lamina 435-*h*, and the third portion of the second electrode layer 430-*i*. The third lamina 435-*i* may or may not be included in the memory cell 105-*e*. Compared to the second pillar 450-*b*, the third pillar 450-*c* may include an additional lamina layer 435, which may further increase the resistivity of the memory cell.

The first pillar 450-*a*, second pillar 450-*b*, and third pillar 450-*c* may each be formed based on etching a stack of materials, which may include one or more of the materials illustrated in cross section 400-*a*, one or more times. In some examples, the materials may be etched in multiple directions (e.g., in two directions), and materials may be deposited before or after a single etching process to form the first pillar 450-*a*, second pillar 450-*b*, and/or third pillar 450-*c* in a deck of memory cells.

For example, the first metal material 410-*a* of the first pillar 450-*a*, the second pillar 450-*b*, or the third pillar 450-*c* may be patterned (e.g., etched) before being deposited. Patterning the first metal material 410-*a* may result in a non-self-aligned access line. In other examples, the first metal material 410-*a* of the first pillar 450-*a*, the second pillar 450-*b*, or the third pillar 450-*b* may be patterned (e.g., etched) after being deposited. Patterning the first metal material 410-*a* may result in a self-aligned access line.

Thus, having one or more laminae 435 including an oxide material, such as hafnium oxide (HfOx), aluminum oxide (AlOx), zirconium oxide (ZrOx), or silicon nitride (SiN), and having a relatively high resistivity compared to at least some if not all other materials (e.g., materials shown in cross section 400-*a*) may mitigate undesirable current spikes that may otherwise during access operations as well as enable a more streamlined and simplified manufacturing process compared to other techniques.

Figure 5A:
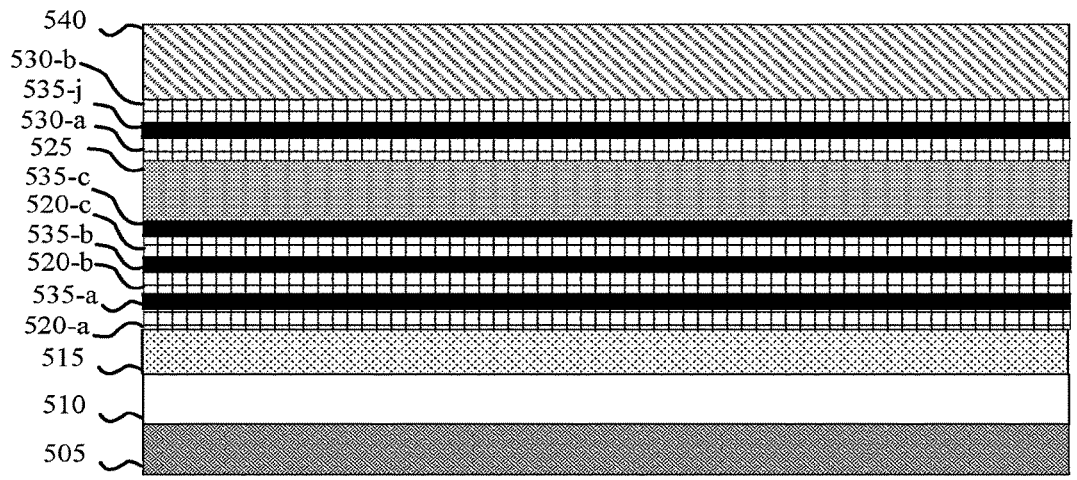
FIGS. 5A and 5B illustrate examples of cross sections of memory devices that support a resistive interface material in accordance with examples as disclosed herein.

FIG. 5A shows a cross section 500-*a* of a portion a memory device after layers of materials have been deposited on a substrate as part of a sequence of processes to fabricate the memory device in accordance with examples of the present disclosure. Various deposition processes may be used to deposit the layers of FIG. 5A, including but not limited to chemical vapor deposition (CVD), metal-organic chemical vapor deposition (MOCVD), plasma-enhanced CVD (PECVD), physical vapor deposition (PVD), sputter deposition, atomic layer deposition (ALD), or molecular beam epitaxy (MBE), or any combination thereof, among other techniques.

Cross section 500-*a* may include a substrate 505. In some examples, substrate 505 may be a silicon substrate, an insulating substrate such as silicon dioxide or silicon nitride, a polysilicon substrate, other examples, or any combination thereof. In some examples, other components of the memory device may be formed on other portions of substrate 505, such as logic circuitry associated with a memory controller, a sense component, or other components.

Cross section 500-*a* may include a first metal material (e.g., a first metal layer) 510. The first metal layer 510 may be a conductive layer formed by depositing a metal material, such as a material that includes tungsten, aluminum, titanium, titanium nitride, silicon, polysilicon, or any combination thereof, above (e.g., onto) substrate 505. The first metal layer 510 may correspond to an access line, such as a word line or bit line, that may be used to access one or more memory cells of the memory device.

Cross section 500-*a* may include a layer (e.g., a resistive material) 515. The layer 515 may be formed by depositing a material having a relatively high resistivity, such as a material that includes tungsten, silicon, nitrogen, or any combination thereof, above (e.g., onto) the first metal layer 510. For example, the layer 515 may be composed of a tungsten silicon nitride (WSiN) material, which may have a higher resistivity than the first metal layer 510.

In some examples, the cross section 500-*a* may include a first electrode layer 520 that includes one or more portions. For example, the first electrode layer may include a first portion 520-*a*, a second portion 520-*b*, and a third portion 520-*c*. The first portion of the first electrode layer 520-*a* may be formed by depositing a first electrode material, such as a conductive carbon-based material, above (e.g., onto) the layer 415. The second portion 520-*b* and third portion 520-*c* of the first electrode material 520 may be the same material as the first portion 520-*a*, for example, or may be a different conductive material, such as a different metal material. The portions of the first electrode material 520 may be deposited above or below one or more laminae 535. For example, the cross section 500-*a* may include one, two, or three laminae 535 and one, two, or three portions of the first electrode layer 520. As described herein, the lamina 535 may be included in the memory cell and may include material properties that mitigates undesirable current spikes during access operations.

The cross section 500-*a* may include a lamina 535 that includes one or more portions. For example, the lamina 535 may include a first portion 535-*a*, a second portion 535-*b*, and a third portion 535-*c*. The portions of the lamina 535 may be formed by depositing a material having a relatively high resistivity, such as a material that includes hafnium, aluminum, oxygen, or any combination thereof, above or below one or more portions of the first electrode 520. For example, the cross section 500-*a* may include one, two, or three laminae 535 and one, two, or three portions of the first electrode layer 520.

Each portion of the lamina 535 may be composed of hafnium oxide (HfOx), aluminum oxide (AlOx), zirconium oxide (ZrOx), or silicon nitride (SiN), and may increase the resistance of a memory cell (e.g., a memory cell composed of a memory material 525) to prevent undesirable current spikes during access operations. The portions of lamina may be deposited in a location that would ordinarily include WSiN. Replacing the WSiN with the lamina 535 may further increase the resistivity of the memory cell, which may better protect the memory cell from undesirable current spikes during access operations. For example, including one or more laminae below the memory material 525 may mitigate current spikes that would otherwise be caused by current flowing from the first metal layer 510 to the memory material 525. Moreover, the lamina 535 may be associated with an etch rate that is the same as or similar to other elements in the stack of materials. Accordingly, the lamina 535 may reduce undesirable current spikes across the memory material 525, while simplifying the fabrication process of the associated memory device due the need for fewer etching and/or material removal steps.

The cross section 500-*a* may include a memory material above the first electrode 520 and lamina 535. The memory material 425 may be formed by depositing a memory material 525 above (e.g., onto) a lamina 535 (e.g., above (e.g., onto) an upper lamina 535). The cell storage material may be, for example, a variable resistance material, a chalcogenide material, or a phase change material, and may be deposited to result in forming a memory cell above the first electrode layer 520.

In some examples, the second electrode layer 530 may include one or more portions. For example, a first portion of the second electrode layer 530-*a* may be formed by depositing a second electrode material above (e.g., onto) the memory material 525. The first portion of the second electrode material 530-*a* may be the same material as the first electrode material, for example, a conductive carbon-based material, or may be a different conductive material, such as a different metal material. The first portion of the second electrode layer 530-*a* may be deposited first (e.g., before a second portion of the second electrode material 530-*b*) such that a lamina (e.g., a lamina) 535-*j* may be deposited between the layers (e.g. after depositing the first portion of the second electrode layer 530-*a* and before depositing the second portion of the second electrode layer 530-b. As described herein, the lamina 535-j may be included as part of the overall resulting memory cell and may include material properties, such as a relatively high resistivity among others, that mitigates undesirable current spikes during access operations, among other benefits. In some examples, the lamina 535-j has a resistivity greater than first metal layer 510, which may include a WSiN material. In some example, the lamina 535-j may have a resistivity greater than all the materials shown in cross section 500-a (e.g., other than the other lamina layers 535).

The second electrode layer 530 may be formed by depositing a second electrode material above (e.g., onto) the memory material 525. The second electrode material 530 may be the same material as the first electrode material, for example, a conductive carbon-based material, or may be a different conductive material, such as a different metal material. Collectively, the first electrode layer 520, the memory material 525, and the second electrode layer 530 may be used to form one or more memory cells, at least some of which if not each of which may be coupled with (e.g., connected to, in contact with) the first metal layer 510. The memory material may be used as a storage element of the memory cell to store a logic state of the memory cell as well as in some examples being a selector device to enable selection of the resulting memory cell.

The cross section 500-a may include a second metal layer 540. The second metal layer 540 may be formed by depositing a metal material above (e.g., onto) the second electrode material 530. The second metal layer 540 may correspond to an access line, such as a word line or bit line, that may be used to access one or more memory cells. In some examples, if the first metal layer 510 corresponds to a word line, the second metal layer 540 may correspond to a bit line, or vice versa. The first electrode layer 520 and second electrode layer 530 may provide conductive connections to first metal layer 510, or second metal layer 540, or both.

Figure 5B:
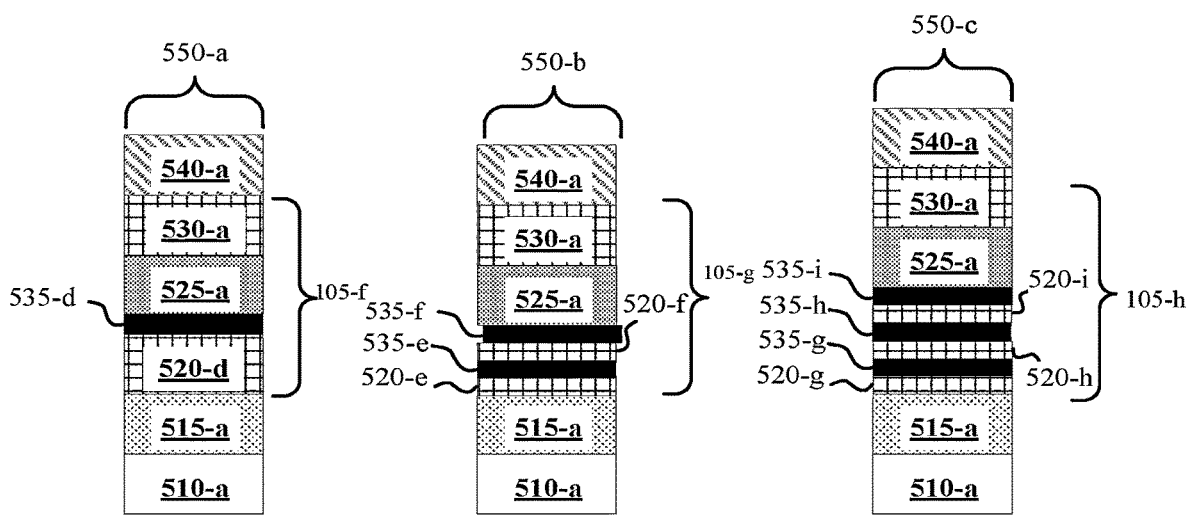

FIG. 5B depicts cross section 500-b, which may represent a cross section of one or more pillars 550 that are formed after one or more deposition and one or more removal processes have been completed. For example, the pillars 550 may represent etching different stacks of materials represented by the cross section 500-a. The pillars 550 may each include a memory cell 105 and may be formed after performing one or more removal procedures to remove a portion of the first metal layer 510-a, the layer 515-a, one or more portions of the first electrode material 520, one or more portions of the lamina 535, the memory material 525-a, the second electrode material 530-a, and the second metal layer 545-a. The removal process may include a planarization process, such as a CMP, and/or an etching process such as chemical etching (also referred to as "wet etching"), plasma etching (also referred to as "dry etching"), other examples, or any combination thereof.

A first pillar 550-a depicted in the cross section 500-b may include a first metal layer 510-a, a layer 515-a, a first electrode layer 520-d, a lamina 535-d, a memory material 525-a, a second electrode layer 530-a, and a second metal layer 540-a. The first pillar 350-a may include a memory cell 105-f, which may include the first electrode layer 520-d, the lamina 535-d, the memory material 525-a, and the second electrode material 530-a.

A second pillar 550-b depicted in the cross section 500-b may include a first metal layer 510-a, a layer 515-a, a first portion of the first electrode material 520-e, a first lamina 535-e, a second portion of the first electrode material 520-f, a second lamina 535-f, a memory material 525-a, a second electrode material 530-a, and a second metal layer 540-a. The second pillar 550-b may include a memory cell 105-g, which may include the first portion of the first electrode material 520-e, the first lamina 535-e, the second portion of the first electrode material 520-f, the second lamina 535-f, the memory material 525-a, the second electrode material 530-a. Compared to the first pillar 550-a, the second pillar 550-b may include an additional lamina layer 535, which may further increase the resistivity of the memory cell.

A third pillar 550-c depicted in the cross section 500-b may include a first metal layer 510-a, a layer 515-a, a first portion of the first electrode material 520-g, a first lamina 535-g, a second portion of the first electrode material 520-h, a second lamina 535-h, a third portion of the first electrode material 520-i, a third lamina 535-I, a memory material 525-a, a second electrode material 530-a, and a second metal layer 540-a. The third pillar 550-c may include a memory cell 105-h, which may include the first portion of the first electrode material 520-e, the first lamina 535-e, the second portion of the first electrode material 520-f, the second lamina 535-f, the third portion of the first electrode material 520-I, the third lamina 535-i, the memory material 525-a, the second electrode material 530-a. Compared to the second pillar 550-b, the third pillar 550-c may include an additional lamina layer 535, which may further increase the resistivity of the memory cell.

The first pillar 550-a, second pillar 550-b, and third pillar 550-c may each be formed based on etching (e.g., one or more times) a stack of materials, which may include one or more of the materials illustrated in cross section 500-a. In some examples, the materials may be etched in multiple directions (e.g., in two directions), and materials may be deposited before or after a single etching process to form the first pillar 550-a, second pillar 550-b, and/or third pillar 550-c in a deck of memory cells.

For example, the first metal material 510-a of the first pillar 550-a, the second pillar 550-b, or the third pillar 550-c may be patterned (e.g., etched) before being deposited. Patterning the first metal material 510-a may result in a non-self-aligned access line. In other examples, the first metal material 510-a of the first pillar 550-a, the second pillar 550-b, or the third pillar 550-b may be patterned (e.g., etched) after being deposited. Patterning the first metal material 510-a may result in a self-aligned access line.

Thus, having one or more laminae 535 including an oxide material, such as hafnium oxide (HfOx), aluminum oxide (AlOx), zirconium oxide (ZrOx), or silicon nitride (SiN), and having a relatively high resistivity compared to at least some if not all other materials (e.g., materials shown in cross section 500-a) may mitigate undesirable current spikes that may otherwise during access operations as well as enable a more streamlined and simplified manufacturing process compared to other techniques.

Figure 6:
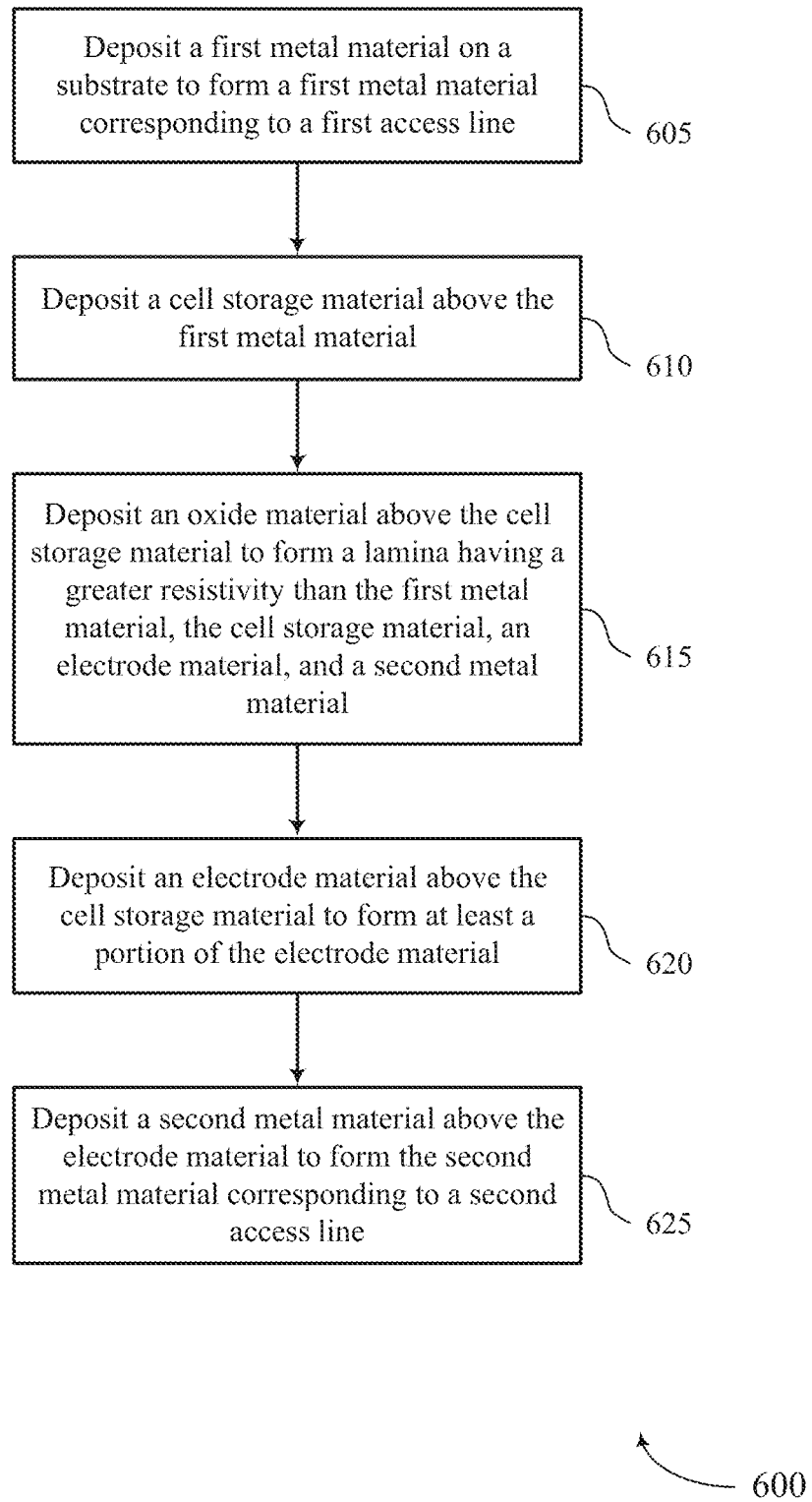
FIG. 6 shows a flowchart illustrating a method or methods that support a resistive interface material in accordance with examples as disclosed herein.

FIG. 6 shows a flowchart illustrating a method or methods 600 that supports a resistive interface material in accordance with aspects of the present disclosure. The operations of method 600 may be implemented by a manufacturing system, or one or more controllers associated with a manufacturing system (e.g., which may be or include a fabrication device), or its components as described herein. For example, the operations of method 600 may be performed by one or more of an etching tool, deposition tool, planarization tool, or other tool as described with reference to FIGS. 3A through 5B. In some examples, a fabrication device may execute a set of instructions to control the functional elements of the fabrication device to perform the described functions. Additionally or alternatively, a fabrication device may perform aspects of the described functions using special-purpose hardware.

At 605, the manufacturing system (e.g., which may be or include the fabrication device, among other components) may deposit a first metal material on a substrate to form a first metal material corresponding to a first access line. The operations of 605 may be performed according to the methods described herein. In some examples, aspects of the operations of 605 may be performed by a deposition tool as described herein.

At 610, the manufacturing system (e.g., which may be or include the fabrication device, among other components) may deposit a cell storage material above the first metal material. The operations of 610 may be performed according to the methods described herein. In some examples, aspects of the operations of 610 may be performed by a deposition tool as described herein. In some examples, the manufacturing system may deposit an electrode material (e.g., a second electrode material) above the first metal material and below the cell storage material. For example, manufacturing system may deposit the cell storage material during a processing step that occurs after 605 and before 610.

At 615, the manufacturing system (e.g., which may be or include the fabrication device, among other components) may deposit an oxide material above the cell storage material to form a lamina having a greater resistivity than the first metal material, the cell storage material, an electrode material, and a second metal material. The operations of 615 may be performed according to the methods described herein. In some examples, aspects of the operations of 615 may be performed by a deposition tool as described herein.

At 620, the manufacturing system (e.g., which may be or include the fabrication device, among other components) may deposit an electrode material above the cell storage material to form at least a portion of the electrode material. The operations of 620 may be performed according to the methods described herein. In some examples, aspects of the operations of 620 may be performed by a deposition tool as described herein.

At 625, the manufacturing system (e.g., which may be or include the fabrication device, among other components) may deposit a second metal material above the electrode material to form the second metal material corresponding to a second access line. The operations of 625 may be performed according to the methods described herein. In some examples, aspects of the operations of 625 may be performed by a deposition tool as described herein.

In some examples, an apparatus as described herein may perform a method or methods, such as the method 600. The apparatus may include features, means, or instructions (e.g., a non-transitory computer-readable medium storing instructions executable by a processor) for depositing a first metal material on a substrate to form a first metal material corresponding to a first access line, depositing a cell storage material above the first metal material, depositing an oxide material above the cell storage material to form a lamina having a greater resistivity than the first metal material, the cell storage material, an electrode material, and a second metal material, depositing an electrode material above the cell storage material to form at least a portion of the electrode material, and depositing a second metal material above the electrode material to form the second metal material corresponding to a second access line.

Some examples of the method 600 and the apparatus described herein may further include operations, features, means, or instructions for depositing the electrode material above the lamina to form at least a second portion of the electrode material, where the lamina may be located between the first portion of the electrode material and the second portion of the electrode material.

Some examples of the method 600 and the apparatus described herein may further include operations, features, means, or instructions for depositing a second oxide material above the second portion of the electrode material to form a second lamina having a greater resistivity than the first metal material, the cell storage material, the first portion of the electrode material, the second portion of the electrode material, and the second metal material, where the second lamina may be located between the second portion of the electrode material and the second metal material.

Some examples of the method 600 and the apparatus described herein may further include operations, features, means, or instructions for depositing a tungsten silicon nitride material above the second portion of the electrode material, where the tungsten silicon nitride material may be located between the second metal material and the second portion of the electrode material.

Some examples of the method 600 and the apparatus described herein may further include operations, features, means, or instructions for depositing the electrode material above the lamina to form at least a second portion of the electrode material, depositing the oxide material above the second portion of the electrode material to form a second lamina, and depositing the electrode material above the lamina to form at least a third portion of the electrode material, where the third portion of the electrode material may be located between the second lamina and the second metal material.

Some examples of the method 600 and the apparatus described herein may further include operations, features, means, or instructions for depositing the oxide material above the second portion of the electrode material to form a third lamina, where the second lamina and the third lamina may have a greater resistivity than the first metal material, the cell storage material, the first portion of the electrode material, the second portion of the electrode material, the third portion of the electrode material, and the second metal material, where the third lamina may be located between the third portion of the electrode material and the second metal material.

In some examples of the method 600 and the apparatus described herein, the oxide material may be deposited above the electrode material and below the second metal material.

Some examples of the method 600 and the apparatus described herein may further include operations, features, means, or instructions for depositing the electrode material above the first metal material to form at least a portion of a second electrode material, and depositing the oxide material above the first metal material to form a second lamina having a greater resistivity than the first metal material, the cell storage material, the electrode material, the second electrode material, and the second metal material, where the second lamina may be located between the first metal material and the cell storage material.

Some examples of the method 600 and the apparatus described herein may further include operations, features, means, or instructions for performing a first etching process in a first direction before depositing the second metal material to remove a portion of the cell storage material, the electrode material, the lamina, and the first metal material.

Some examples of the method 600 and the apparatus described herein may further include operations, features, means, or instructions for performing a second etching process in a second direction after depositing the second metal material to remove a portion of the cell storage material, the electrode material, the lamina, and the second metal material.

Some examples of the method 600 and the apparatus described herein may further include operations, features, means, or instructions for depositing a tungsten silicon nitride material above the first metal material, where the tungsten silicon nitride material may be located between the first metal material and the cell storage material.

In some examples of the method 600 and the apparatus described herein, the lamina includes a thickness less than or equal to 1 nm.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a first metal material formed on a substrate and corresponding to a first access line, a memory material formed above the first metal material, where the memory material includes a chalcogenide material configured as a selector material, an electrode material formed above the memory material, a lamina formed above the memory material, at least a portion of the electrode material, or both, where the lamina includes an oxide material having a resistivity greater than the first metal material, the electrode material, and a second metal material, and the second metal material formed above the lamina and corresponding to a second access line.

In some examples, the lamina may be formed above the electrode material and below the second metal material.

In some examples, a first portion of the lamina may be in contact with the second metal material, and a second portion of the lamina may be in contact with the electrode material, where the first portion of the lamina or the second portion of the lamina would otherwise be in contact with a tungsten silicon nitride material.

In some examples, the electrode material may include operations, features, means, or instructions for a first portion, and a second portion, where the lamina may be formed between the first portion of the electrode material and the second portion of the electrode material.

Some examples of the apparatus may include a second lamina formed above the second portion of the electrode material, where the second lamina includes an oxide material having a resistivity greater than the first metal material, the first portion of the electrode material, the second portion of the electrode material, and the second metal material.

In some examples, the electrode material may include operations, features, means, or instructions for a third lamina formed above the third portion of the electrode material, where the third lamina includes an oxide material having a resistivity greater than the first metal material, the first portion of the electrode material, the second portion of the electrode material, the third portion of the electrode material, and the second metal material.

Some examples of the apparatus may include a tungsten silicon nitride material above the second portion of the electrode material and below the second metal material.

Some examples of the apparatus may include a second electrode material formed below the memory material and above the first memory material, and a fourth lamina formed between the memory material and the first metal material, where the fourth lamina includes an oxide material having a resistivity greater than the first metal material, the electrode material, and the second metal material.

In some examples, the lamina may have a thickness less than or equal to 1 nm.

In some examples, the lamina includes aluminum oxide, hafnium oxide, zirconium oxide, silicon nitride, or a combination thereof.

An apparatus is described. The apparatus may include a first metal material formed on a substrate and corresponding to a first access line, a first electrode material formed above the first metal material, a lamina formed above at least a portion of the first electrode material, where the lamina includes an oxide material having a greater resistivity than the first metal material and the first electrode material, the oxide material including aluminum oxide or hafnium oxide, a memory material formed above the lamina, where the memory material includes a chalcogenide material configured as a selector material, a second electrode material formed above the memory material, and a second metal material formed above the second electrode material and corresponding to a second access line.

Some examples of the apparatus may include a second lamina formed above the memory material, where the second lamina includes an oxide material having a greater resistivity than the first metal material and the first electrode material, the oxide material including aluminum oxide or hafnium oxide.

In some examples, the lamina and the second lamina include a same oxide material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first metal material formed on a substrate and corresponding to a first access line;
a memory material formed above the first metal material, wherein the memory material comprises a chalcogenide material configured as a selector material;
an electrode material formed above the memory material;
a lamina formed above the memory material, at least a portion of the electrode material, or both, wherein the lamina comprises an oxide material having a resistivity greater than the first metal material, the electrode material, and a second metal material; and
the second metal material formed above the lamina and corresponding to a second access line.

2. The apparatus of claim 1, wherein the lamina is formed above the electrode material and below the second metal material.

3. The apparatus of claim 2, wherein a first portion of the lamina is in contact with the second metal material, and a second portion of the lamina is in contact with the electrode material, wherein the first portion of the lamina or the second portion of the lamina would otherwise be in contact with a tungsten silicon nitride material.

4. The apparatus of claim 1, wherein the electrode material comprises:
a first portion; and
a second portion, wherein the lamina is formed between the first portion of the electrode material and the second portion of the electrode material.

5. The apparatus of claim 4, further comprising:
a second lamina formed above the second portion of the electrode material, wherein the second lamina comprises an oxide material having a resistivity greater than the first metal material, the first portion of the electrode material, the second portion of the electrode material, and the second metal material.

6. The apparatus of claim 5, wherein the electrode material comprises a third portion, wherein the apparatus further comprises a third lamina formed above the third portion of the electrode material, wherein the third lamina comprises an oxide material having a resistivity greater than the first metal material, the first portion of the electrode material, the second portion of the electrode material, the third portion of the electrode material, and the second metal material.

7. The apparatus of claim 4, further comprising:
a tungsten silicon nitride material above the second portion of the electrode material and below the second metal material.

8. The apparatus of claim 1, further comprising:
a second electrode material formed below the memory material and above the first metal material; and
a fourth lamina formed between the memory material and the first metal material, wherein the fourth lamina comprises an oxide material having a resistivity greater than the first metal material, the electrode material, and the second metal material.

9. The apparatus of claim 1, wherein the lamina has a thickness less than or equal to 1 nm.

10. The apparatus of claim 1, wherein the lamina comprises aluminum oxide, hafnium oxide, zirconium oxide, silicon nitride, or a combination thereof.

11. A method, comprising:
depositing a first metal material on a substrate to form a first metal material corresponding to a first access line;
depositing a cell storage material above the first metal material;
depositing an oxide material above the cell storage material to form a lamina having a greater resistivity than the first metal material, the cell storage material, an electrode material, and a second metal material;
depositing an electrode material above the cell storage material to form at least a portion of the electrode material; and
depositing a second metal material above the electrode material to form the second metal material corresponding to a second access line.

12. The method of claim 11, wherein the oxide material is deposited above a first portion of the electrode material, the method further comprising:
depositing the electrode material above the lamina to form at least a second portion of the electrode material, wherein the lamina is located between the first portion of the electrode material and the second portion of the electrode material.

13. The method of claim 12, further comprising:
depositing a second oxide material above the second portion of the electrode material to form a second lamina having a greater resistivity than the first metal material, the cell storage material, the first portion of the electrode material, the second portion of the electrode material, and the second metal material, wherein the second lamina is located between the second portion of the electrode material and the second metal material.

14. The method of claim 12, further comprising:
depositing a tungsten silicon nitride material above the second portion of the electrode material, wherein the tungsten silicon nitride material is located between the second metal material and the second portion of the electrode material.

15. The method of claim 11, wherein the oxide material is deposited above a first portion of the electrode material, the method further comprising:
depositing the electrode material above the lamina to form at least a second portion of the electrode material;
depositing the oxide material above the second portion of the electrode material to form a second lamina; and
depositing the electrode material above the lamina to form at least a third portion of the electrode material, wherein the third portion of the electrode material is located between the second lamina and the second metal material.

16. The method of claim 15, further comprising:
depositing the oxide material above the second portion of the electrode material to form a third lamina, wherein the second lamina and the third lamina have a greater resistivity than the first metal material, the cell storage material, the first portion of the electrode material, the second portion of the electrode material, the third portion of the electrode material, and the second metal material, wherein the third lamina is located between the third portion of the electrode material and the second metal material.

17. The method of claim 11, wherein the oxide material is deposited above the electrode material and below the second metal material.

18. The method of claim 11, further comprising:
depositing the electrode material above the first metal material to form at least a portion of a second electrode material, wherein the cell storage material is above the portion of the second electrode material; and depositing the oxide material above the first metal material to form a second lamina having a greater resistivity than the first metal material, the cell storage material, the electrode material, the second electrode material, and the second metal material, wherein the second lamina is located between the first metal material and the cell storage material.

19. The method of claim 11, further comprising:

performing a first etching process in a first direction before depositing the second metal material to remove a portion of the cell storage material, the electrode material, the lamina, and the first metal material.

20. The method of claim 19, further comprising:

performing a second etching process in a second direction after depositing the second metal material to remove a portion of the cell storage material, the electrode material, the lamina, and the second metal material.

21. The method of claim 11, further comprising:

depositing a tungsten silicon nitride material above the first metal material, wherein the tungsten silicon nitride material is located between the first metal material and the cell storage material.

22. The method of claim 11, wherein the lamina comprises a thickness less than or equal to 1 nm.

23. An apparatus, comprising:

a first metal material formed on a substrate and corresponding to a first access line;

a first electrode material formed above the first metal material;

a lamina formed above at least a portion of the first electrode material, wherein the lamina comprises an oxide material having a greater resistivity than the first metal material and the first electrode material, the oxide material comprising aluminum oxide or hafnium oxide;

a memory material formed above the lamina, wherein the memory material comprises a chalcogenide material configured as a selector material;

a second electrode material formed above the memory material; and a second metal material formed above the second electrode material and corresponding to a second access line.

24. The apparatus of claim 23, further comprising:

a second lamina formed above the memory material, wherein the second lamina comprises an oxide material having a greater resistivity than the first metal material and the first electrode material, the oxide material comprising aluminum oxide or hafnium oxide.

25. The apparatus of claim 24, wherein the lamina and the second lamina comprise a same oxide material.

* * * * *